United States Patent
Chen

(10) Patent No.: US 9,436,226 B2
(45) Date of Patent: Sep. 6, 2016

(54) TABLET COMPUTER

(71) Applicant: POSIFLEX TECHNOLOGY, INC., New Taipei (TW)

(72) Inventor: Mao-Chiang Chen, New Taipei (TW)

(73) Assignee: POSIFLEX TECHNOLOGY, INC., Taipei (TW)

( * ) Notice: Subject to any disclaimer, the term of this patent is extended or adjusted under 35 U.S.C. 154(b) by 100 days.

(21) Appl. No.: 14/497,298

(22) Filed: Sep. 25, 2014

(65) Prior Publication Data
US 2015/0355681 A1    Dec. 10, 2015

(30) Foreign Application Priority Data
Jun. 4, 2014   (TW) .............................. 103119376 A

(51) Int. Cl.
G06F 1/16      (2006.01)
H05K 5/02     (2006.01)
G06K 7/10     (2006.01)

(52) U.S. Cl.
CPC ........... *G06F 1/1654* (2013.01); *G06F 1/1626* (2013.01); *G06F 1/1628* (2013.01); *G06F 1/1633* (2013.01); *G06F 1/1635* (2013.01); *G06K 7/10881* (2013.01); *H05K 5/023* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,349,497 A * | 9/1994 | Hanson | ................... | B60R 11/02 16/422 |
| 5,675,524 A * | 10/1997 | Bernard | ................ | G06F 1/1626 361/679.41 |
| 5,835,343 A * | 11/1998 | Johns | ..................... | F16M 11/10 361/679.27 |
| 6,053,410 A * | 4/2000 | Wike, Jr. | .................. | G06F 1/16 235/462.43 |
| 6,109,528 A * | 8/2000 | Kunert | ............... | G06K 7/10881 235/462.45 |
| 6,856,506 B2 * | 2/2005 | Doherty | ................ | G06F 1/1632 16/329 |
| 7,255,317 B2 * | 8/2007 | Huang | ................... | F16M 11/10 248/125.7 |
| 7,317,611 B2 * | 1/2008 | Dittmer | .................. | F16M 11/04 248/917 |
| 7,652,873 B2 * | 1/2010 | Lee | ....................... | E05B 65/006 248/917 |

(Continued)

FOREIGN PATENT DOCUMENTS

CN      103294977 A     9/2013
EP        2703940 A2    3/2014

(Continued)

*Primary Examiner* — Lisa Lea Edmonds
(74) *Attorney, Agent, or Firm* — CKC & Partners Co., Ltd.

(57) ABSTRACT

A tablet computer having a detachable handle includes a tablet main body equipped with a connecting board on a bottom surface thereof, and a grip unit removably connecting to the connecting board of the tablet main body. The grip unit is convenient to a user to easily hold the tablet main body with only one hand, and input with the other hand. An extended battery is stored in a chamber of the grip unit can supply power to the tablet main body and/or a main battery in the tablet main body. The grip unit further includes a barcode scanner and a scan start button so that a user can hold the grip unit with one hand and trigger the barcode scanner with the index finger thereof.

13 Claims, 6 Drawing Sheets

(56) References Cited

U.S. PATENT DOCUMENTS

| | | | | |
|---|---|---|---|---|
| 7,748,632 | B2* | 7/2010 | Coleman | G06F 1/1626 235/462.43 |
| 7,857,226 | B2* | 12/2010 | Mangaroo | G06K 7/10881 235/462.48 |
| 7,992,787 | B2* | 8/2011 | Mangaroo | H05K 5/0247 235/462.45 |
| 8,025,236 | B2* | 9/2011 | Mangaroo | G06K 7/10881 235/462.43 |
| 8,567,682 | B2* | 10/2013 | Boyd | G06K 7/10 235/472.01 |
| 8,638,557 | B2* | 1/2014 | Tsai | F16M 11/041 248/919 |
| 8,662,399 | B2* | 3/2014 | Vassura | G06K 7/10881 235/375 |
| 8,770,539 | B1* | 7/2014 | Hsu | B60R 11/0241 248/126 |
| 8,773,845 | B2* | 7/2014 | Leung | G06F 1/1632 361/679.01 |
| 8,800,875 | B2* | 8/2014 | Mangaroo | G06K 7/10881 235/472.01 |
| 8,885,337 | B2* | 11/2014 | Schanz | B60R 11/0258 248/229.11 |
| 8,925,878 | B2* | 1/2015 | Hsu | A47B 23/043 248/122.1 |
| 8,941,989 | B2* | 1/2015 | Pollex | F16M 11/041 248/418 |
| 9,010,597 | B2* | 4/2015 | Prescott | B60R 7/088 224/197 |
| 9,202,095 | B2* | 12/2015 | Martin | G06K 7/0004 |
| 2003/0213822 | A1* | 11/2003 | Lautner | A44C 5/0007 224/221 |
| 2003/0222149 | A1* | 12/2003 | Solomon | G06F 1/1669 235/472.01 |
| 2012/0170212 | A1* | 7/2012 | Gallouzi | F16M 11/041 361/679.56 |
| 2013/0206942 | A1* | 8/2013 | Trotsky | F16M 11/041 248/274.1 |
| 2013/0235521 | A1 | 9/2013 | Burch et al. | |
| 2014/0226281 | A1* | 8/2014 | Emami | F16M 13/00 361/679.56 |
| 2014/0328020 | A1* | 11/2014 | Galant | F16M 11/105 361/679.56 |

FOREIGN PATENT DOCUMENTS

| | | |
|---|---|---|
| TW | 201020728 A | 6/2010 |
| TW | M400664 U | 3/2011 |
| TW | 201219093 A | 5/2012 |
| TW | M428395 U | 5/2012 |
| TW | M477753 U | 5/2014 |
| WO | 2012050980 A2 | 4/2012 |

* cited by examiner

TABLET COMPUTER

RELATED APPLICATIONS

This application claims priority to Taiwan Application Serial Number 103119376, filed Jun. 4, 2014, which is herein incorporated by reference.

BACKGROUND

1. Field of Invention

The invention relates to a tablet computer, and particularly to a tablet computer having a detachable handle.

2. Description of Related Art

Nowadays, the functionality of the tablet computer is very comprehensive, such as the Internet access, watch videos, play games, read e-books. For factories and stores, the tablet computer can be further equipped with a barcode scanner to take stock the products thereof. When a user utilizes the tablet computer to take stock their products, the user normally hand carries the tablet computer to positions of the products.

The tablet computer has a wide display, for example, a 12 inches display, to provide a better viewability and operability. However, the 12 inches tablet computer is difficult to stably hold by one hand so that the user is not convenient to operate the tablet computer and the load of the hand of the user is also increased. In addition, the thickness of the tablet computer is also increased with an additional barcode scanner. Furthermore, a main battery of the tablet computer can supply power for the tablet computer only a predetermined duration. The main battery of the tablet computer has to be recharged while the main battery is exhausted. Therefore, frequently discharges and recharges of the main battery can reduce the life span of the main battery of the tablet computer. The main battery is also difficult to be replaced when the main battery is damaged.

SUMMARY

The invention provides a tablet computer having a detachable handle, which is convenient in operation with one hand.

According to an aspect of the invention, a tablet computer having a detachable handle is provided. The tablet computer having the detachable handle includes a tablet main body having a connecting board at a bottom portion thereof and a grip unit detachably assembled to the connecting board of the tablet main body.

According to an embodiment of the invention, the grip unit has a grip shell including a chamber inside; a covering plate covering a top portion of the chamber of the grip shell; and an extended battery and a circuit board disposed in the chamber, the extended battery electrically connecting to the circuit board, the circuit board including a plurality of first connecting terminals electrically connecting to second connecting terminals disposed at a bottom portion of the tablet main body, the extended battery supplying power to the tablet main body and/or a main battery in the tablet main body.

According to an embodiment of the invention, two sides of the connecting board respectively have at least one opening and an L-shaped locking slot connected to the opening, two inner walls of a top portion of the grip shell respectively have at least one L-shaped fastener, and the L-shaped fastener locks on the L-shaped locking slot through the opening of the connecting board.

According to an embodiment of the invention, one end of the connecting board has a positioning slot, the positioning slot has a longitudinal slot and a second transverse slot; the covering plate of the grip unit has a first transverse slot corresponding to the second transverse slot, and the covering plate has a position operating element including a pivot shaft at one end of the position operating element, an operating button at another end and a positioning column between the pivot shaft and the operating button, the pivot shaft pivoted on the covering plate, the operating button protruded from the grip shell outwardly, the positioning column disposed in the first transverse slot and the second transverse slot through the longitudinal slot of the connecting board.

According to an embodiment of the invention, the grip shell has a power detecting switch and a power indicator light, the power detecting switch and the power indicator light electrically connected to the circuit board to detect and display remaining power of the extended battery.

According to an embodiment of the invention, the extended battery is a replaceable and rechargeable battery.

According to an embodiment of the invention, two sides of the grip shell respectively have a sliding slot, two sides of the battery cover respectively have a sliding rail corresponding to the sliding slot.

According to an embodiment of the invention, the tablet main body has a charging port electrically connecting to the main battery.

According to an embodiment of the invention, the tablet main body has a charging port electrically connecting to the main battery and the extended battery.

According to an embodiment of the invention, the connecting board has an aperture, the second connecting terminals are exposed outwardly through the aperture, the covering plate of the grip unit has a plurality of through holes, and the first connecting terminals are exposed outwardly through the through holes.

According to an embodiment of the invention, the grip shell of the grip unit has a barcode scanner and a scan start button at a front end, the barcode scanner and the scan start button electrically connect to the circuit board.

According to an embodiment of the invention, the grip shell has anti-drop flange at a bottom portion.

According to an embodiment of the invention, the tablet computer having the detachable handle further has a cover plate to cover the connecting board when the grip unit is removed from the tablet main body.

The tablet computer having the detachable handle according to one embodiment of the present invention, a user can conveniently hold the tablet main body by one hand holding the grip unit and uses another hand to operate the tablet computer so that the tablet main body can hand be carried and operated anywhere and the load of the user's hand can be effectively reduced. Furthermore, the extended battery stored in the chamber of the grip unit can effectively supply to the tablet main body and/or the main battery of the tablet main body to extend the power of the tablet main body, increase the utilization life of the tablet main body, and increase the battery lifespan of the main battery. Furthermore, the barcode scanner and the scan start button are disposed on the grip unit so that the user can use one hand to hold the grip unit and trigger the barcode reader with the scan start button without increase the thickness of the tablet main body.

DESCRIPTION OF THE EMBODIMENTS

Figure 1:
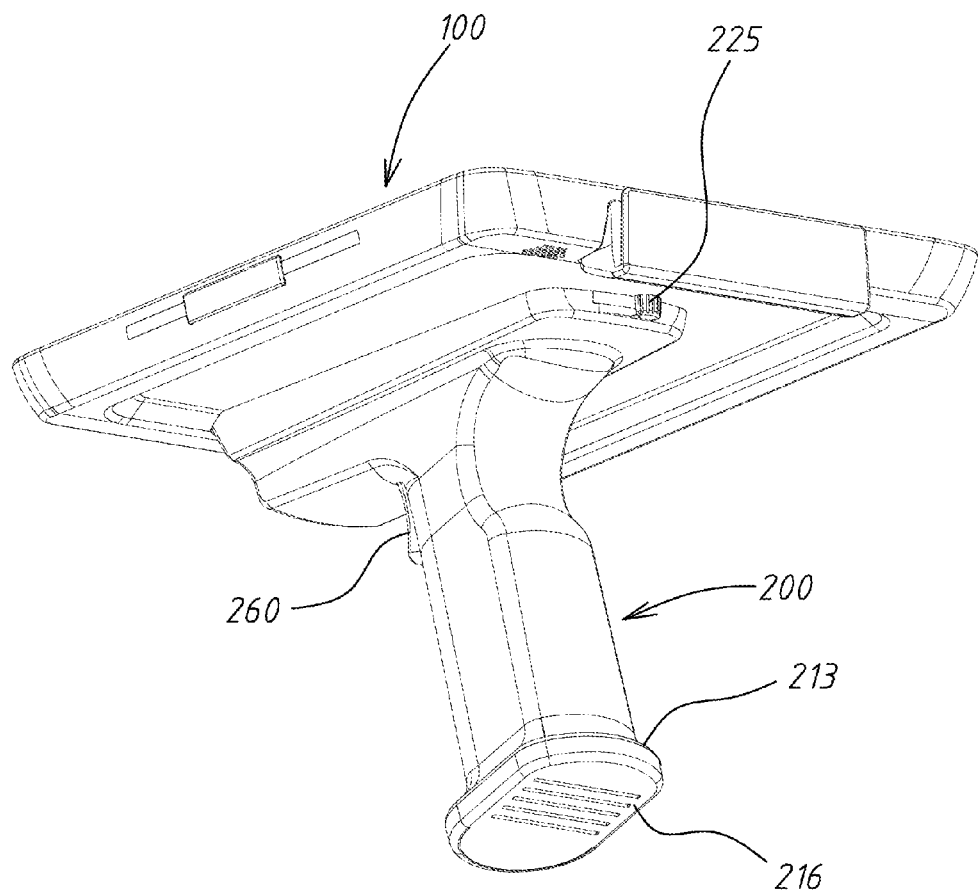
FIG. 1 is an outside view of a tablet computer having a detachable handle according to an embodiment of the invention.
Figure 2:
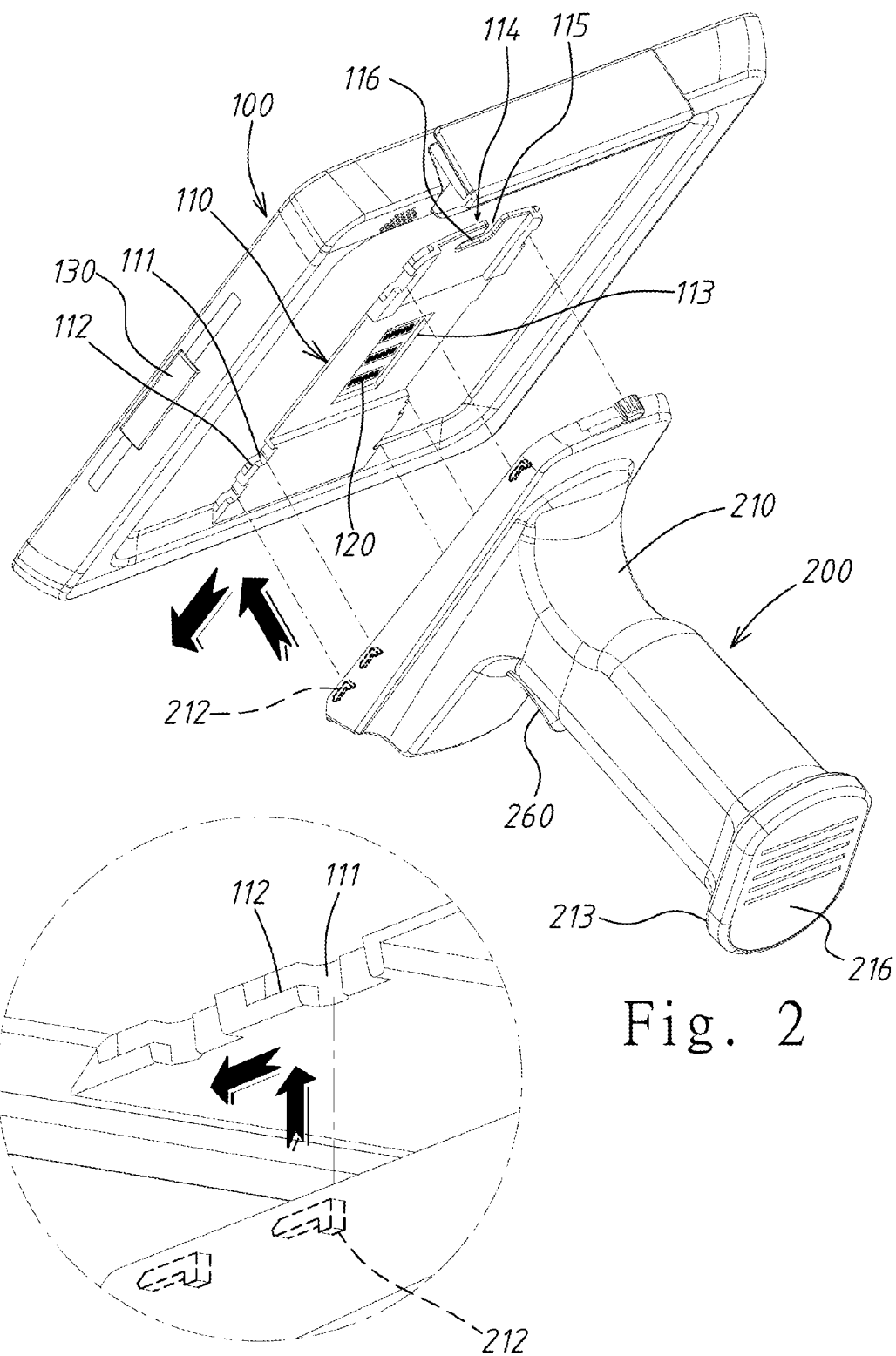
FIG. 2 is a partially exploded view of the tablet computer having the detachable handle as shown in FIG. 1.
Figure 3:
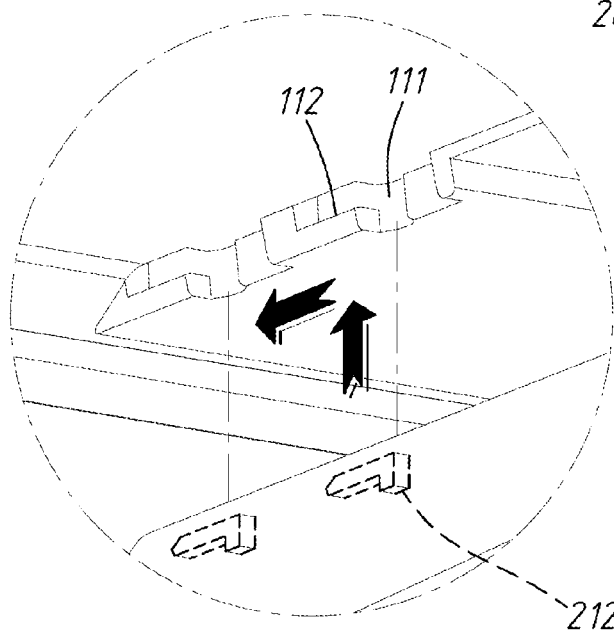
FIG. 3 is a partially enlarged view of the tablet computer having the detachable handle as shown in FIG. 1.
Figure 4:
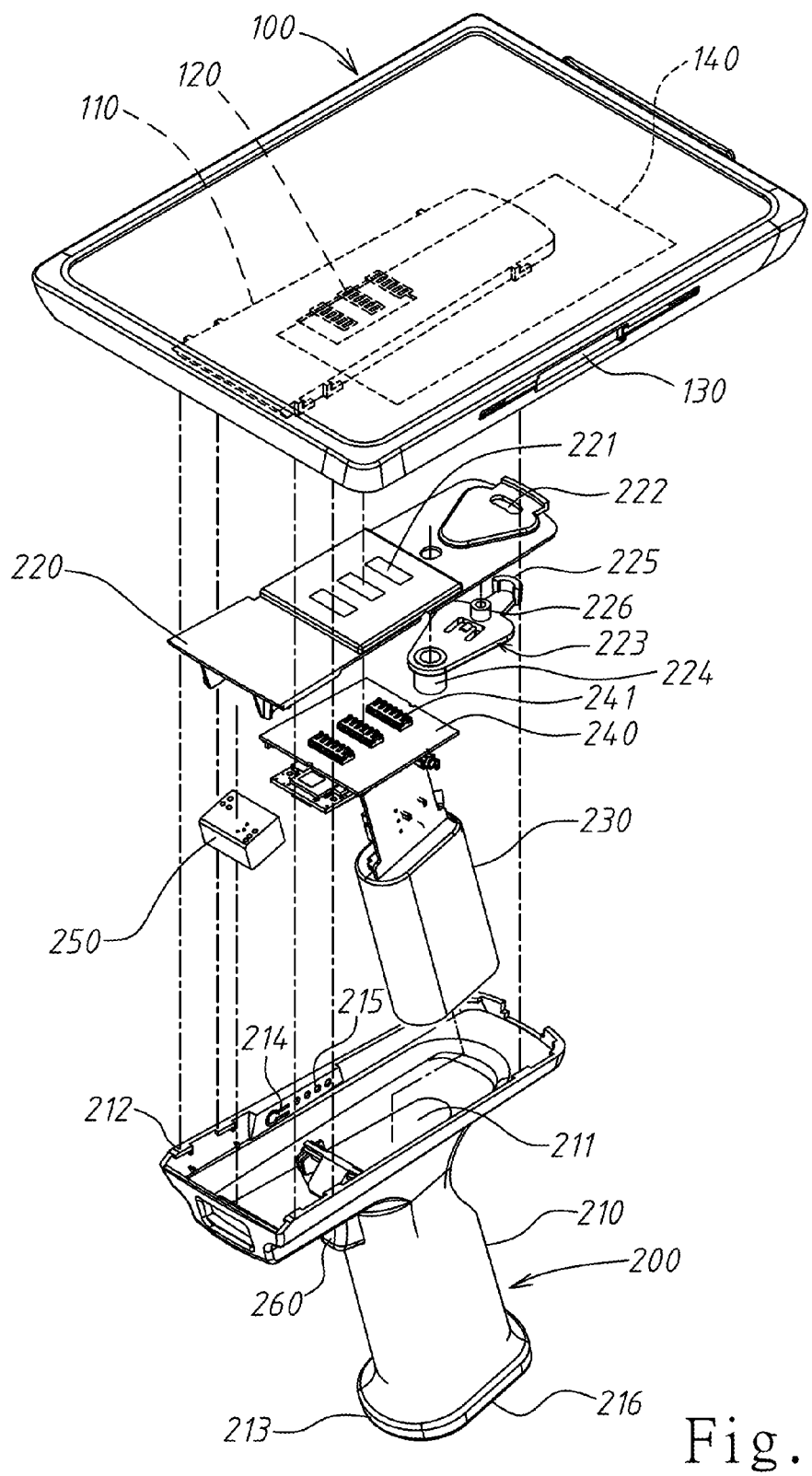
FIG. 4 is a detailed exploded view of the tablet computer having the detachable handle as shown in FIG. 1.
Figure 5:
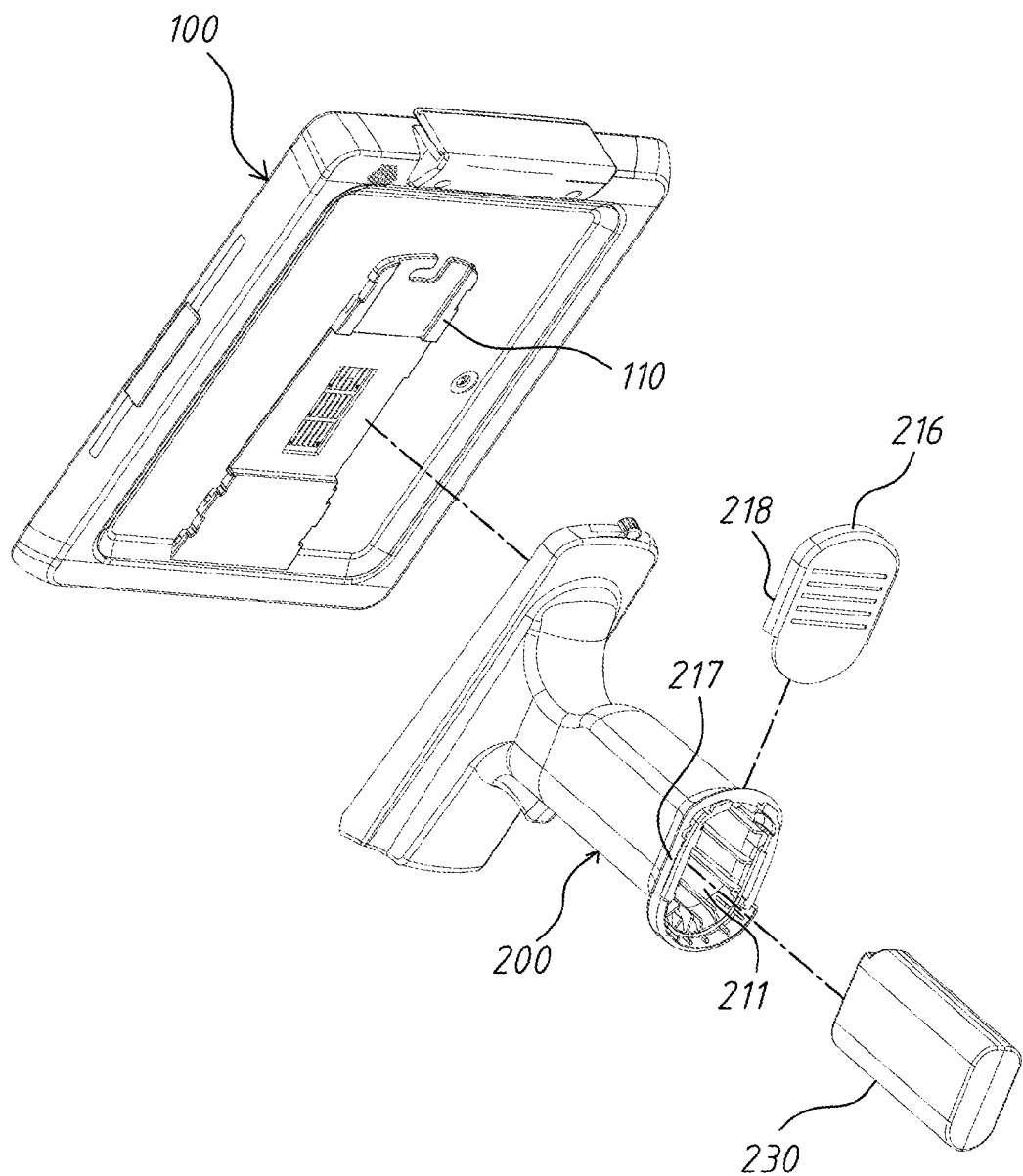
FIG. 5 is a bottom exploded view of the grip shell of the tablet computer having the detachable handle as shown in FIG. 2.
Figure 6:
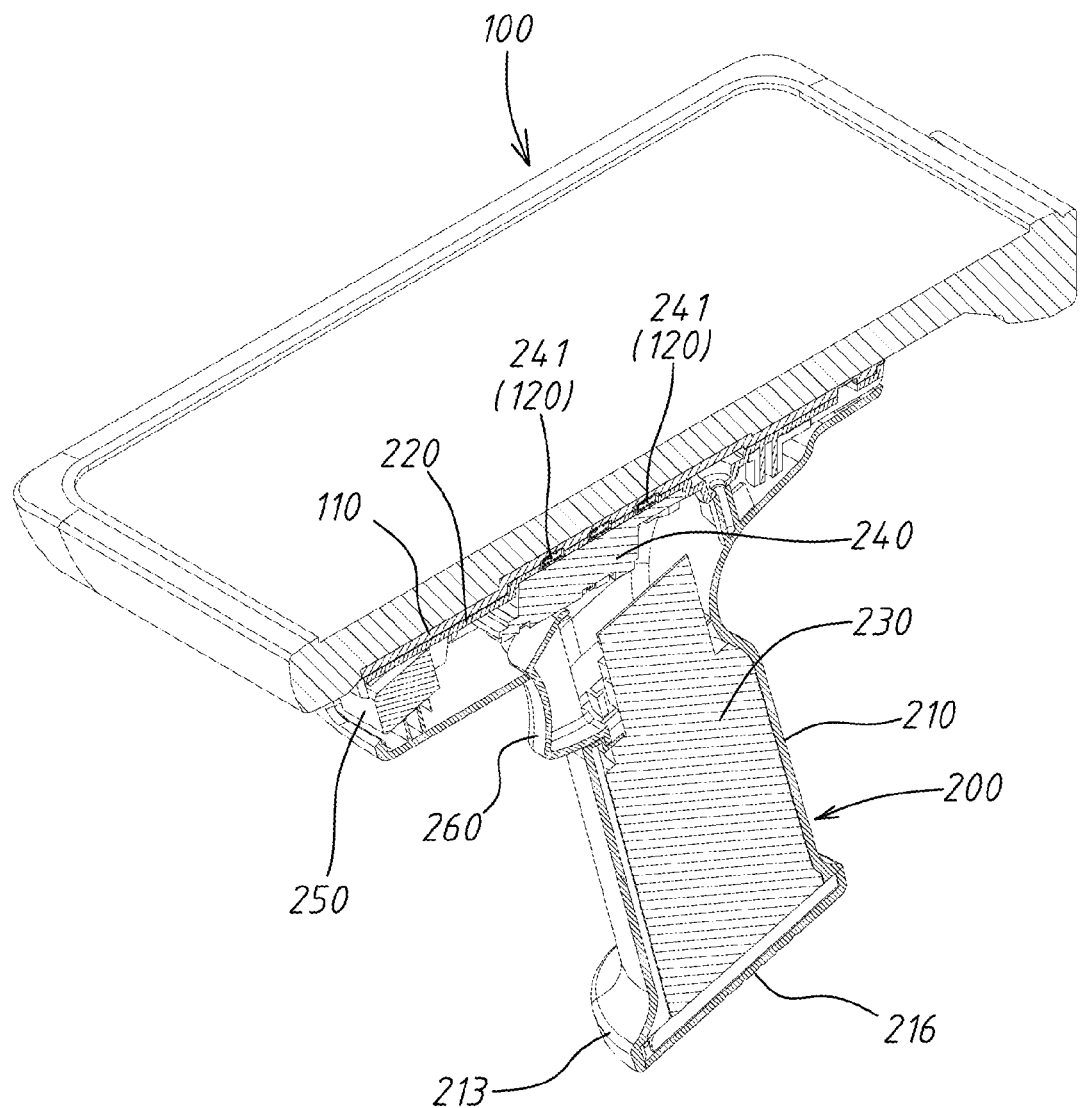
FIG. 6 is a sectional view of the grip shell of the tablet computer having the detachable handle as shown in FIG. 1.

The foregoing and other technical contents, features and functions of the invention will be clearly presented through the following detailed description of embodiments with reference to the accompanying drawings.

Referring to FIGS. 1-6, a tablet computer having a detachable handle according to an embodiment of the invention is disclosed. The tablet computer having a detachable handle includes a tablet main body 100 and a grip unit 200.

The bottom surface of the tablet main body 100 has a connecting board 110 with an aperture 113 to allow second connecting terminals 120 equipped under the bottom surface of the tablet main body 100 exposing outwardly so as to electrically connect to grip unit 200. Both sides of the connecting board 110 includes a plurality of openings 111 and L-shaped locking slots 112 respectively connected to corresponding one of the openings 111 to assemble with the grip unit 200. One end of the connecting board 110 has a positioning slot 114 including a longitudinal slot 115 and a second transverse slot 116 connected to the longitudinal slot 115 to position the grip unit 200 and the tablet main body 100 while assembling together.

The grip unit 200 is detachable from the connecting board 110 of the tablet main body 100. The grip unit 200 has a grip shell 210, a covering plate 220, an extended battery 230 and a circuit board 240.

The grip shell 210 has a chamber 211 therein and a plurality of L-shaped fasteners 212 are disposed on the inner surface of a top portion of the grip shell 210. The L-shaped fasteners 212 respectively connect the L-shaped locking slots 112 through the openings 111 of the connecting board 110 of the tablet main body 100 after the L-shaped fasteners 212 are pushed to move forwardly to lock with the L-shaped locking slots 112. Therefore, the grip unit 200 and the tablet main body 100 are assembled together. A user can easily hold the tablet main body 100 with the grip unit 200 by one hand, and another hand of the user can operate the tablet main body 100. In addition, the user can hold the tablet main body 100 with the grip unit 200 at the center of gravity of the tablet main body 100 so as to conveniently and stably hold the tablet main body 100 and reduce the load of user's hand. A bottom portion of the grip shell 210 has an anti-drop flange 213 to avoid the grip unit 200 dropping from user's hand.

When the user wants to detach the grip unit 200 from the tablet main body 100, the grip unit 200 is moved backwardly to unlock the L-shaped fasteners 212 of the grip unit 200 from the L-shaped locking slots 112 of the tablet main body 100 to disassemble the grip unit 200 and the tablet main body 100. Therefore, the tablet main body 100 and the grip unit 200 can be easily carried and the tablet main body 100 can also be operated alone.

Figure 7:
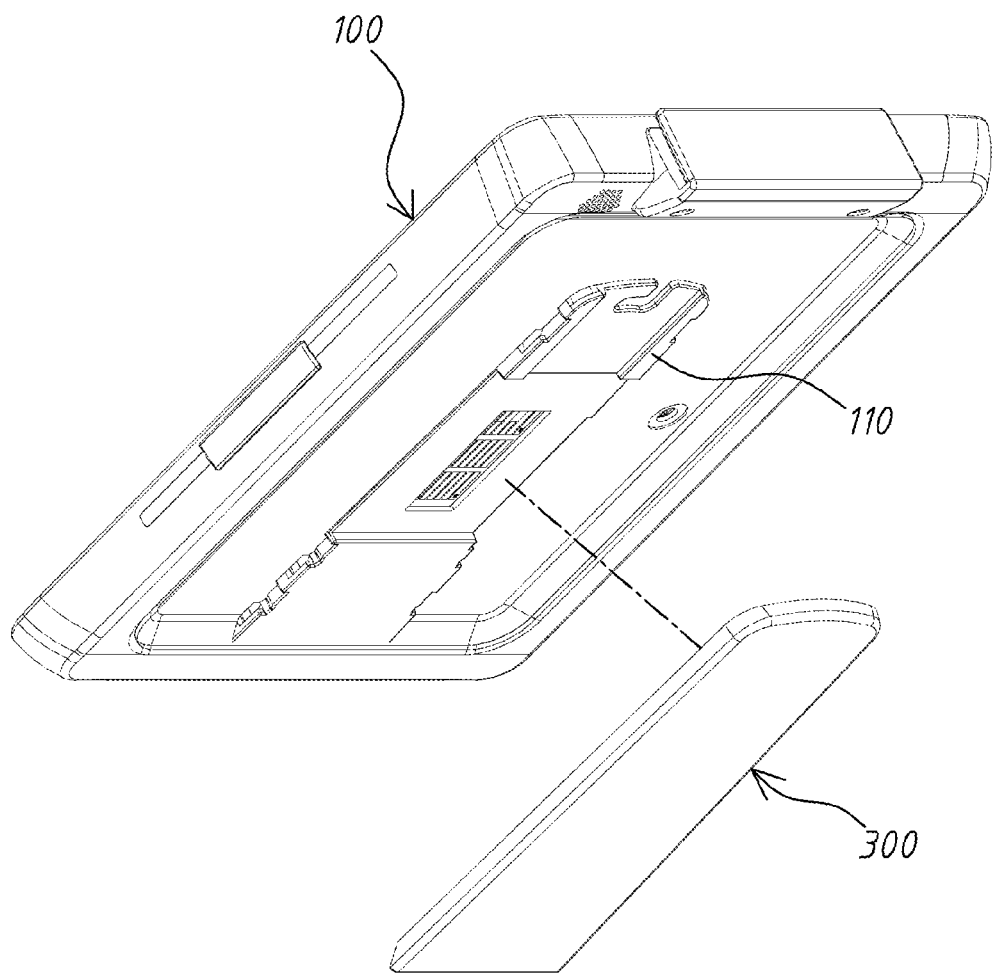
FIG. 7 is a schematic view of the tablet main body of the tablet computer as shown in FIG. 2, and the grip unit is removed from tablet main body and a cover plate is added for the tablet main body.

Referring to FIG. 7 simultaneously, an embodiment of the tablet computer having a detachable handle according to the present invention further includes a cover plate 300 to cover the connecting board 110 when the grip unit 200 is detached from the tablet main body 100. The cover plate 300 can cover the connecting board 110 to keep the completeness of the tablet main body 100.

The covering plate 220 covers on the top portion of the chamber 211 of the grip shell 210 and the covering plate 220 has a plurality of through holes 221. The covering plate 220 further has a positioning control mechanism correspondingly disposed at the positioning slot 114 of connecting board 110 to provide a stable assembly of the grip unit 200 and the tablet main body 100. The positioning control mechanism includes a first transverse slot 222 disposed on the covering plate 220 and corresponding to the second transverse slot 116 of the connecting board 110, and the covering plate 220 further has a position operating element 223 having a pivot shaft 224 at one end of the position operating element 223 and an operating button 225 disposed on the other end of the position operating element 223, and a positioning column 226 disposed between the pivot shaft 224 and the operating button 225. The pivot shaft 224 is pivoted on the covering plate 220, and the operating button 225 is protruded from the grip shell 210. While the grip unit 200 and the tablet main body 100 are assembled, the positioning column 226 is disposed in the first transverse slot 222 of the covering plate 220 and the second transverse slot 116 of the connecting board 110 through the longitudinal slot 115 of the connecting board 110. While moving the operating button 225, the position operating element 223 is rotated around the pivot shaft 224 leftward or rightward to move the positioning column 226 in the first transverse slot 222 and the second transverse slot 116 leftward or rightward. When the positioning column 226 does not align with the longitudinal slot 115 of the positioning slot 114, the grip unit 200 cannot be moved forwardly and backwardly so that the grip unit 200 cannot be removed at a positioning status. When the positioning column 226 aligns with the longitudinal slot 115 of the positioning slot 114, the positioning column 226 of the grip unit 200 can be moved in the longitudinal slot 115 and the grip unit 200 can be moved forwardly and backwardly so that the grip unit 200 can be removed at a decoupling status.

The extended battery 230 and the circuit board 240 are stored in the chamber 211 of the grip shell 210. The extended battery 230 electrically connects to the circuit board 240. The circuit board 240 has first connecting terminals 241, a controller and so on. The first connecting terminals 241 are exposed outside through a plurality of through holes 221 of the covering plate 220. When the L-shaped fasteners 212 of the grip unit 200 are coupled to the L-shaped locking slots 112 of the tablet main body 100, the first connecting terminals 241 of the grip unit 200 are electrically connected to the second connecting terminals 120 of the tablet main body 100. The extended battery 230 can provide power to the tablet main body 100 and/or a main battery 140 of the tablet main body 100. That is to say, the tablet main body 100 can first use the power of the extended battery 230. After the extended battery 230 is exhausted, the tablet main body 100 can continuously use the power of the main battery 140 thereof. When a new extended battery 230 is equipped, the extended battery 230 can also charge the main battery 140. Therefore, the extended battery 230 can extend the power of the tablet main body 100 to increase the battery life. In addition, the extended battery 230 can reduce the recharging frequency of the main battery 140 to improve the battery lifespan of the main battery.

The extended battery 230 can be a replaceable and rechargeable battery to allow recharging with recharging equipment.

In addition, the tablet main body 100 further has a charging port 130 for charging the main battery 140 and subsequently charging the extended battery 230.

A bottom portion of the grip shell 210 has a battery cover 216. Two sides of the bottom surface of the grip shell 210 have sliding slots 217 respectively. Two sides of the battery cover 216 have sliding rails 218 corresponding to the sliding slots 217. The sliding rail 218 and the sliding slot 217 can guide each other to allow the battery cover 216 being able to fast and conveniently couple or decouple with the grip shell 210 so that the extended battery 230 can conveniently insert into or withdraw from the chamber 211 of the grip shell 210.

The grip shell 210 has a power detecting switch 214 and a power indicator light 215 electrically connected to the circuit board 240 to detect and display the remaining power of the extended battery 230.

A barcode scanner 250 and a scan start button 260 are disposed at a front portion of the grip shell 210 to electrically connect to the circuit board 240 and scan the bar code of the goods. Since the barcode scanner 250 and the scan start button 260 are disposed on the grip shell 210 rather than the tablet main body so that the thickness of the tablet main body is not increased. Furthermore, a user can use one hand to hold the grip unit 200 and trigger the barcode scanner 250 with the index finger thereof by pressing the scan start button 260.

According to one embodiment of the tablet computer having the detachable handle of the present invention, a user can conveniently hold the tablet main body 100 by one hand holding the grip unit 200 so that the tablet main body can hand be carried and operated anywhere and the hand's load of the user can be effectively reduced. Furthermore, the extended battery 230 stored in the chamber 211 of the grip unit can effectively supply to the tablet main body and/or the main battery 140 of the tablet main body to extend the power of the tablet main body, increase the utilization life of the tablet main body 100, and increase the battery lifespan of the main battery 140. Furthermore, the barcode scanner 250 and the scan start button are disposed on the grip unit so that the user can use one hand to hold the grip unit and trigger the barcode reader with the scan start button without increase the thickness of the tablet main body.

Although the invention has been disclosed with reference to the above embodiments, these embodiments are not intended to limit the invention. It will be apparent to those of skills in the art that various modifications and variations can be made without departing from the spirit and scope of the invention. Therefore, the scope of the invention shall be defined by the appended claims.

What is claimed is:

1. A tablet computer, comprising:
a tablet main body comprising a connecting board at a bottom portion of the tablet main body; and
a grip unit detachably assembled to the connecting board of the tablet main body, wherein the grip unit comprises:
a grip shell comprising a chamber inside;
a covering plate covering a top portion of the chamber of the grip shell; and
an extended battery and a circuit board disposed in the chamber, the extended battery electrically connecting to the circuit board, the circuit board comprising a plurality of first connecting terminals electrically connecting to second connecting terminals disposed at a bottom portion of the tablet main body, the extended battery supplying power to the tablet main body and/or a main battery in the tablet main body.

2. The tablet computer of claim 1, wherein two sides of the connecting board respectively comprise at least one opening and an L-shaped locking slot connected to the opening, two inner walls of a top portion of the grip shell respectively comprise at least one L-shaped fastener, and the L-shaped fastener locks on the L-shaped locking slot through the opening of the connecting board.

3. The tablet computer of claim 2, wherein one end of the connecting board has a positioning slot, the positioning slot comprises a longitudinal slot and a second transverse slot; the covering plate of the grip unit comprises a first transverse slot corresponding to the second transverse slot, and the covering plate comprises a position operating element comprising a pivot shaft at one end of the position operating element, an operating button at another end and a positioning column between the pivot shaft and the operating button, the pivot shaft pivoted on the covering plate, the operating button protruded from the grip shell outwardly, the positioning column disposed in the first transverse slot and the second transverse slot through the longitudinal slot of the connecting board.

4. The tablet computer of claim 1, wherein the grip shell comprises a power detecting switch and a power indicator light, the power detecting switch and the power indicator light electrically connected to the circuit board to detect and display remaining power of the extended battery.

5. The tablet computer of claim 1, wherein the extended battery is a replaceable and rechargeable battery.

6. The tablet computer of claim 5, further comprising a removable battery cover at a bottom portion of the grip shell.

7. The tablet computer of claim 6, wherein two sides of the grip shell respectively comprise a sliding slot, two sides of the battery cover respectively comprise a sliding rail corresponding to the sliding slot.

8. The tablet computer of claim 1, wherein the tablet main body comprises a charging port electrically connecting to the main battery.

9. The tablet computer of claim 1, wherein the tablet main body comprises a charging port electrically connecting to the main battery and the extended battery.

10. The tablet computer of claim 1, wherein the connecting board comprises an aperture, the second connecting terminals are exposed outwardly through the aperture, the covering plate of the grip unit comprises a plurality of through holes, and the first connecting terminals are exposed outwardly through the through holes.

11. The tablet computer of claim 1, wherein the grip shell of the grip unit comprises a barcode scanner and a scan start button at a front end, the barcode scanner and the scan start button electrically connect to the circuit board.

12. The tablet computer of claim 1, wherein the grip shell comprises anti-drop flange at a bottom portion.

13. The tablet computer of claim 1, further comprises a cover plate to cover the connecting board when the grip unit is removed from the tablet main body.

* * * * *